(12) United States Patent  
Kitayama et al.

(10) Patent No.: US 9,276,194 B2  
(45) Date of Patent: Mar. 1, 2016

(54) BONDING METHOD FOR BONDING METAL PLATE AND PIEZOELECTRIC BODY

(71) Applicant: Murata Manufacturing Co., Ltd., Nagaokakyo-shi, Kyoto-fu (JP)

(72) Inventors: Hiroki Kitayama, Nagaokakyo (JP); Hideo Nakagoshi, Nagaokakyo (JP); Kiyoshi Kurihara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 290 days.

(21) Appl. No.: 13/921,247

(22) Filed: Jun. 19, 2013

(65) Prior Publication Data

US 2013/0276977 A1    Oct. 24, 2013

Related U.S. Application Data

(60) Division of application No. 13/337,331, filed on Dec. 27, 2011, now Pat. No. 8,492,959, which is a continuation of application No. PCT/JP2010/060516, filed on Jun. 22, 2010.

(30) Foreign Application Priority Data

Jul. 17, 2009   (JP) .................................. 2009-168633

(51) Int. Cl.
*H01L 41/22*     (2013.01)
*H01L 41/313*    (2013.01)
(Continued)

(52) U.S. Cl.
CPC . *H01L 41/22* (2013.01); *C09J 9/02* (2013.01); *C09J 11/04* (2013.01); *C09J 11/06* (2013.01); *F04B 45/047* (2013.01); *H01L 41/0478* (2013.01); *H01L 41/29* (2013.01); *H01L 41/313* (2013.01); *C08K 3/04* (2013.01);
(Continued)

(58) Field of Classification Search
CPC ..... H01L 41/0478; H01L 41/22; H01L 41/29; H01L 41/313; H01L 41/0973; H01G 9/0032; H01G 9/155; F04B 45/047; C09J 9/02; C09J 11/04; C09J 11/06; C08K 3/04; C08K 7/16; C08K 2201/011; Y10T 29/42; Y10T 29/49005; Y10T 29/49126
See application file for complete search history.

(56) References Cited

U.S. PATENT DOCUMENTS 3,896,076 A * 7/1975 Watanabe et al. ........ C08K 3/04
4,670,074 A * 6/1987 Broussoux et al. ..... Y10T 29/42
(Continued)

FOREIGN PATENT DOCUMENTS

CN      1340573 A      3/2002
JP      59227966 A  * 12/1984

*Primary Examiner* — A. Dexter Tugbang
(74) *Attorney, Agent, or Firm* — Keating & Bennett, LLP (57) ABSTRACT

A bonding method that provides excellent conductivity and bonding between a piezoelectric body and a metal plate includes a metal plate and an electrode of a piezoelectric body bonded to one another with an electrically conductive adhesive so as to provide electrical conductivity, the electrically conductive adhesive includes carbon black with a nano-level average particle size, and has a paste form included in a solventless or solvent-based resin so that the carbon black forms an aggregate with an average particle size of about 1 μm to about 50 μm. The electrically conductive adhesive is applied between the metal plate and the electrode of the piezoelectric body, and the metal plate and the piezoelectric body are subjected to heating and pressurization so that the carbon black aggregate is deformed, thereby hardening the electrically conductive adhesive.

7 Claims, 4 Drawing Sheets

(51) Int. Cl.
    *C09J 11/06*     (2006.01)
    *C09J 9/02*     (2006.01)
    *C09J 11/04*     (2006.01)
    *F04B 45/047*     (2006.01)
    *H01L 41/047*     (2006.01)
    *H01L 41/29*     (2013.01)
    *H01G 9/00*     (2006.01)
    *C08K 3/04*     (2006.01)
    *C08K 7/16*     (2006.01)
    *H01L 41/09*     (2006.01)

(52) U.S. Cl.
    CPC ............ *C08K 7/16* (2013.01); *C08K 2201/011* (2013.01); *H01G 9/0032* (2013.01); *H01G 9/155* (2013.01); *H01L 41/0973* (2013.01); *Y10T 29/42* (2015.01); *Y10T 29/49005* (2015.01); *Y10T 29/49126* (2015.01)

(56) References Cited

U.S. PATENT DOCUMENTS 6,072,692 A * 6/2000 Hiratsuka et al. ...... H01G 9/155
8,492,959 B2 * 7/2013 Kitayama et al. .......... C09J 9/02
                                                        310/324

* cited by examiner

BONDING METHOD FOR BONDING METAL PLATE AND PIEZOELECTRIC BODY

BACKGROUND OF THE INVENTION

1. Field of the Invention

The present invention relates to a bonding structure for a metal plate and a piezoelectric body, such as a piezoelectric vibration plate for use in a driver of a piezoelectric microblower or other suitable piezoelectric device, and a bonding method therefor.

2. Description of the Related Art

Piezoelectric microblowers have been known as blowers for effectively releasing heat produced in housings of portable electronic devices, or as blowers for supplying oxygen required for the generation of electricity in fuel cells (see, for example, WO2008/069266). The piezoelectric microblower refers to a kind of pump using a vibration plate which produces a bending vibration by applying a voltage, and has the advantages of having a simple structure, being able to be configured to have a small and thin size, and providing low power consumption.

Figure 1:
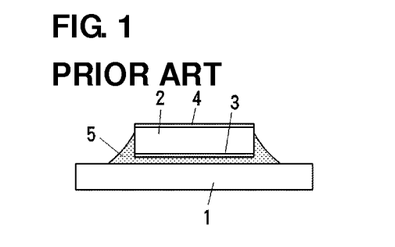
FIG. 1 shows a known example of a piezoelectric vibration plate which includes a piezoelectric body bonded to a metal plate.

FIG. 1 shows an example of a vibration plate for use in a piezoelectric microblower. In FIG. 1, a piezoelectric body (piezoelectric ceramic plate) 2 including electrodes 3, 4 on front and back sides thereof is bonded onto a metallic diaphragm 1. One electrode 3 and the diaphragm 1 are electrically connected to each other. When a predetermined alternating-current voltage is applied between the diaphragm 1 and the electrode 4 of the piezoelectric body 2, the entire vibration plate produces a bending vibration, thereby enabling it to pump the air. It is to be noted that the vibration plate is not limited to the piezoelectric body 2 directly bonded onto the diaphragm 1, and may have various configurations, such as a vibration plate which has another metal plate bonded onto the diaphragm 1 and the piezoelectric body 2 bonded thereon, and a vibration plate which has a piezoelectric body 2 bonded onto both of the front and back sides of the diaphragm 1.

Figures 2A, 2B, 2C, 2D:
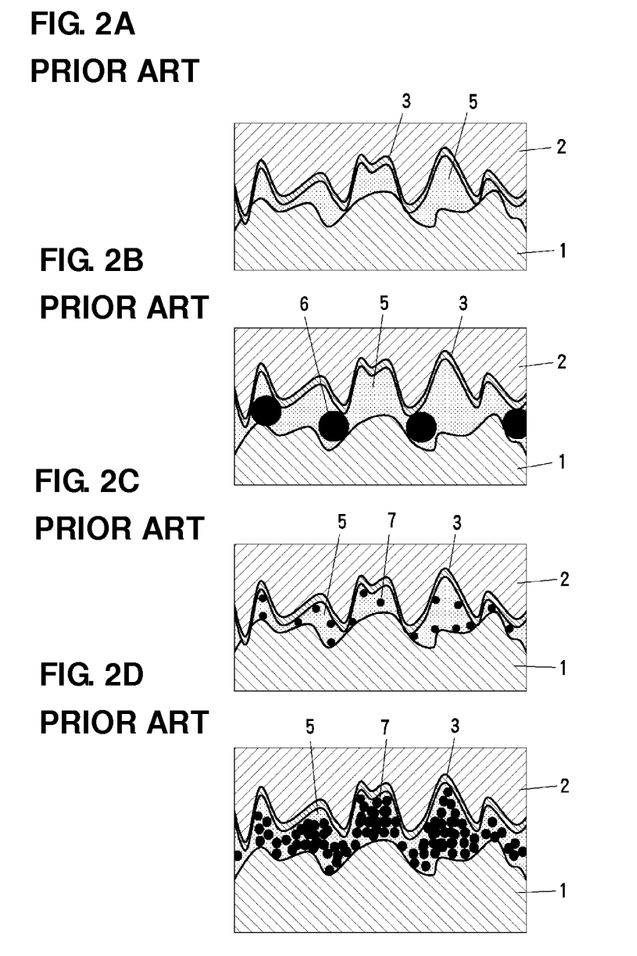
FIGS. 2A to 2D are enlarged cross-sectional views illustrating conventional bonding structures.

FIGS. 2A to 2C show examples of a bonding structure between the electrode 3 of the piezoelectric body 2 and the metal plate 1 (diaphragm).

FIG. 2A is an example of using an adhesive 5 including no electrically conductive aid, which is intended to provide electrical conduction through contact (ohmic contact) between the electrode 3 and the metal plate 1 by reducing the adhesive thickness between the piezoelectric body 2 and the metal plate 1 to the greatest extent possible.

In FIG. 2B, carbon spheres 6 are added as an electrically conductive aid to the adhesive 5, thereby providing conductivity through the carbon spheres 6. The carbon spheres 6 have a diameter, for example, on the order of 20 μm, and the electrode 3 is not directly connected to the metallic plate 1.

In FIG. 2C, carbon black 7 with an average particle size of several tens of nm is added as an electrically conductive aid to the adhesive 5, thereby providing conductivity through the carbon black 7 in addition to conductivity through contact between the electrode 3 of the piezoelectric body 2 and the metal plate 1.

In the case of using the adhesive 5 including no electrically conductive aid as shown in FIG. 2A, the problem of an increase in resistance value (a decrease in conductivity) is caused when the adhesive is swollen in a humidity test after the bonding. In the case of using the adhesive 5 with the carbon spheres 6 added thereto as in FIG. 2B, the piezoelectric body 2 is likely to have cracks caused from the carbon spheres 6, and moreover, the thickness of the adhesive is increased, thereby resulting in the problem of degraded vibration characteristics of the piezoelectric body 2. In addition, the problem of increased resistance value is caused because of the contact with the electrode function as point contact, or because the largest particle functions as a spacer, whereas the smaller-size particles fail to contribute to electrical conduction. In the case of using the carbon black 7 with a minute particle size as in FIG. 2C, the viscosity-thixotropy of the adhesive is affected significantly by the content of the carbon black 7, which has the problem of having an adverse effect on the workability and application property. Furthermore, the problem of an increase in resistance value (a decrease in conductivity) is also caused when the adhesive is swollen in a humidity test after the bonding.

Japanese Patent Application Laid-Open No. 2001-316655 discloses an electrically conductive adhesive which is used for bonding between an active material layer and a collector in an energy storage element. This adhesive is an electrically conductive adhesive in a paste form, which includes carbon powder (for example, carbon black) as an electrically conductive material, a resin as a binding agent, and water as a solvent, in which primary particles of the carbon powder have a weight-average particle size in the range of 5 nm to 100 nm, the amount of the carbon powder falls within the range of 5 weight % to 50 weight % with respect to the total amount of the carbon powder and resin, and the moisture content of the electrically conductive adhesive in the paste form is supposed to fall within the range of 70 weight % to 95 weight %.

FIG. 2D shows an example of a bonding structure using the electrically conductive adhesive disclosed in Japanese Patent Application Laid-Open No. 2001-316655. As in the case of FIG. 2C, the carbon black 7 is added as an electrically conductive aid to the adhesive 5, thereby providing conductivity through the carbon black 7 without direct electrical conduction between the electrode 3 and the metal plate 1. Since a larger amount of carbon black 7 is added than in FIG. 2C, the conductivity is believed to be improved more than in FIG. 2C.

However, when the carbon black 7 having a particle size of 5 nm to 100 nm is contained in the resin in a large amount of 5 weight % to 50 weight %, the viscosity or thixotropy of the adhesive is greatly increased so as to adversely affect the application stability (variations in the amount of application, leveling properties after the application). Therefore, this problem is solved by water (70 weight % to 95 weight %) included in the paste in Japanese Patent Application Laid-Open No. 2001-316655. For this reason, it is not possible to solve the problem described in the case of a reaction system (such as an epoxy resin) which does not use water. In addition, the larger content of the carbon black 7 relatively reduces the amount of resin, thus decreasing the adhesion. Furthermore, the large amount of water included as a solvent provides a porous formation when the adhesive is hardened, thereby resulting in the problem of making the adhesive more likely to be swollen by absorption of water, and thus, lacking long-term reliability.

SUMMARY OF THE INVENTION

To overcome the problems described above, preferred embodiments of the present invention provide a bonding structure and a bonding method which have excellent conductivity and bonding property between a piezoelectric body and a metal plate.

A preferred embodiment of the present invention provides a bonding structure that preferably includes a metal plate, a piezoelectric body including an electrode on the side opposed to the metal plate, and an electrically conductive adhesive including carbon black as an electrically conductive aid, and bonding the metal plate and the electrode of the piezoelectric body so as to have electrical conductivity, wherein the electrically conductive adhesive before hardening includes carbon black with a nano-level average particle size, and is a paste included in a solventless or solvent-based resin so that the carbon black provides an aggregate with an average particle size of about 1 µm to about 50 µm, for example, and wherein the bonding structure is configured by applying the electrically conductive adhesive in the paste form between the metal plate and the electrode of the piezoelectric body, subjecting the metal plate and the piezoelectric body to heating, and pressurization to deform the carbon black aggregate, and hardening the electrically conductive adhesive.

Another preferred embodiment of the present invention provides a bonding method in which a metal plate and a piezoelectric body including an electrode on the side opposed to the metal plate are bonded to each other via an electrically conductive adhesive including carbon black as an electrically conductive aid, so as to have electrical conductivity between the metal plate and the electrode of the piezoelectric body, and the bonding method preferably includes the steps of applying the electrically conductive adhesive in a paste form between the metal plate and the electrode of the piezoelectric body, which includes carbon black with a nano-level average particle size, and is included in a solventless or solvent-based resin so that the carbon black forms an aggregate with an average particle size of about 1 µm to about 50 µm, for example, and after applying the electrically conductive adhesive, subjecting the metal plate and the piezoelectric body to heating and pressurization to deform the carbon black aggregate, and hardening the electrically conductive adhesive.

The electrically conductive adhesive preferably includes carbon black with a nano-level average particle size, and is a paste included in a resin so that the carbon black forms an aggregate with an average particle size of about 1 µm to about 50 µm, for example. The aggregate refers to primary particles of the carbon black bonded by an intermolecular force or other relevant force to provide a cluster with an average particle size of about 1 µm or more, for example. Therefore, as compared to the same amount of carbon black included in a dispersed state in a resin, the viscosity or thixotropy of the adhesive is much less affected, thereby resulting in improved workability and application property. The aggregate itself has no rigidity, and is deformed to follow a concavity and a convexity of the metal plate and piezoelectric body when the metal plate and the piezoelectric body are subjected to heating and pressurization. Thus, conductivity can be provided with less damage to the piezoelectric body and without significantly contributing to an increase in the thickness of the adhesive. The electrical conductivity between the metal plate and the piezoelectric body can preferably be achieved by not only the electrical conduction through the carbon black, but also by direct contact between the metal plate and the electrode of the piezoelectric body, thus providing a higher electrical conductivity (lower resistance value).

The average particle size in preferred embodiments of the present invention can preferably be obtained by, for example, capturing a SEM image of powder, applying binarization processing to the obtained image to obtain the area of the powder, and converting the area into circles with a diameter. It is possible to capture SEM images of both primary particles and secondary particles.

The particle size of the aggregate preferably has a lower limit size of about 1 µm, for example, because the size less than about 1 µm greatly increases the resin viscosity, and on the other hand, the upper limit size of greater than about 50 µm makes the size of the aggregate larger than the concavity and convexity at the surfaces of the metal plate and electrode, thus increasing the thickness of the adhesive. Therefore, the upper limit size is preferably about 50 µm, for example.

In a preferred embodiment of the present invention, the carbon black is preferably hardened while remaining as the aggregate rather than in a dispersed state, and thus, the metal plate and the electrode of the piezoelectric body can be electrically connected to each other in the dispersed state in island shapes (anisotropic electrical conductivity), rather than electrical conduction over the entire surface (isotropic electrical conductivity) as in the case of an electrically conductive adhesive using conventional carbon black. More specifically, while conductivity is provided in the direction in which the metal plate is opposed to the electrode, no conductivity is provided in the planar direction. This anisotropically conductive structure greatly improves the contact probability of the carbon black spectacularly, as compared to a case in which the same or substantially the same amount of carbon black in provided a dispersed state, thereby enabling a higher conductivity (lower resistance value) to be achieved. Furthermore, when the piezoelectric body is bonded to the metal plate, a fillet is formed by the electrically conductive adhesive around the piezoelectric body, and there is a possibility that short-circuiting may be caused if the fillet partially wraps around the upper electrode of the piezoelectric body. The electrically conductive adhesive according to various preferred embodiments of the present invention has anisotropic electrical conductivity, and thus, effectively and securely prevents this short-circuiting.

While the electrically conductive adhesive according to various preferred embodiments of the present invention may preferably be any solventless or solvent-based electrically conductive adhesive, at least electrically conductive adhesives using a water-based solvent are excluded. The solventless electrically conductive adhesive refers to an electrically conductive adhesive including carbon black that is added to a liquid resin, whereas the solvent-based electrically conductive adhesive refers to an electrically conductive adhesive including carbon black that is added to an organic solvent in which a polymer is dissolved. Solventless resins include, for example, an epoxy resin, whereas solvent-based resins include, for example, an acrylic resin. In each case, the hardened state is not porous, is less likely to cause swelling of the adhesive due to absorption of water in terms of long-term reliability, and is free of the problem of decrease in conductivity.

The carbon black included in the electrically conductive adhesive preferably has a nano-level average particle size, and is preferably, for example, carbon black with an average particle size of about 5 nm to about 300 nm, for example. The carbon black is added to the resin so that primary particles of the carbon black preferably form an aggregate with an average particle size of about 1 µm to 50 µm, for example, in the resin. Therefore, an appropriate dispersing/kneading treatment is preferably performed so that the carbon black forms an aggregate with an intended particle size in the resin.

The metal plate and the electrode of the piezoelectric body are preferably subjected to pressurization so that the distance between the metal plate and the electrode is less than the average particle size for the aggregate. More specifically, the distance between the metal plate and the piezoelectric body is preferably less than the average particle size for the aggregate in the electrically conductive adhesive in the paste form. This distance sandwiches most of the aggregate between the metal plate and the electrode of the piezoelectric body, thereby enabling reliable electrical conductivity to be achieved.

The resin included in the electrically conductive adhesive is preferably a resin which has a dense composition in a hardened state, has high weather resistance and heat resistance, and is less likely to undergo swelling even in a humidity test after bonding. Specifically, the resin may preferably be an epoxy resin, an acrylic resin, a urethane resin, other suitable resin, for example.

The amount of the carbon black in the electrically conductive adhesive is preferably about 1 weight % to about 10 weight % with respect to the total amount of the carbon black and resin, for example. This low content of the carbon black reduces the viscosity or thixotropy of the adhesive, thereby resulting in favorable workability and application property, and even with the low content of the carbon black, the formation of the aggregate can provide favorable electrical conductivity.

As described above, according to various preferred embodiments of the present invention, the electrically conductive adhesive in a paste form which has the carbon black added to a solventless or a solvent-based resin so as to form an aggregate with an average particle size of about 1 μm to about 50 μm is preferably used to apply the electrically conductive adhesive between the metal plate and the electrode of the piezoelectric body, and the metal plate and the piezoelectric body are subjected to heating and pressurization to harden the electrically conductive adhesive. Thus, the aggregate is deformed so as to follow the concavity and the convexity of the metal plate and of the electrode of the piezoelectric body, thereby enabling outstanding conductivity to be provided with less damage to the piezoelectric body and without significantly contributing to the increase in the thickness of the adhesive. In addition, since favorable electrical conduction is achieved while the content of the carbon black is reduced, the absolute amount of the resin can be increased, thereby resulting in a decrease in the viscosity or thixotropy of the adhesive, and in favorable workability and application property, and favorable adhesion can be achieved between the metal plate and the piezoelectric body. Furthermore, since the resin does not include any water, the hardened state is advantageously not porous, is less likely to cause swelling of the adhesive due to absorption of water, and thus has a significantly improved long-term reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 3A:
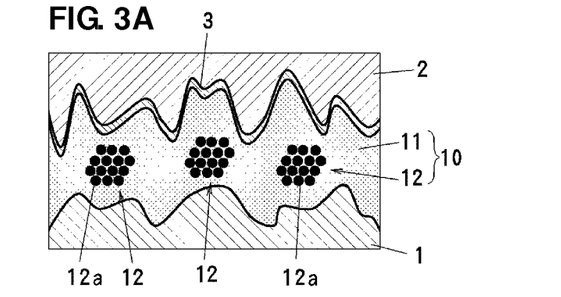
FIGS. 3A and 3B are cross-sectional views of a bonding structure according to a preferred embodiment of the present invention before and after heating and pressurization.
Figure 3B:
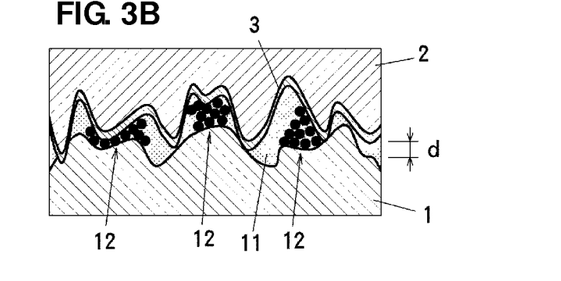

FIGS. 3A and 3B show a bonding structure of a piezoelectric vibration plate according to a first preferred embodiment of the present invention, where FIG. 3A shows the bonding structure before heating and pressurization and FIG. 3B shows the bonding structure after the heating and pressurization. As in the case of FIG. 1, a piezoelectric body 2 including electrodes 3, 4 on both sides thereof is bonded onto a metal plate 1, such as a diaphragm, with an electrically conductive adhesive 10 interposed therebetween. The electrically conductive adhesive 10 is preferably a paste including a solventless resin 11 such as, for example, an epoxy resin including carbon black 12a therein which has an average particle size of about 5 nm to about 300 nm, and preferably about 5 nm to about 100 nm, for example, added thereto, and the additive amount of the carbon black 12a is preferably about 1 weight % to about 10 weight %, for example, with respect to the total amount of the carbon black 12a and resin 11. The carbon black 12a is preferably primarily present in clusters in the resin 11 so as to form an aggregate 12 with an average grain size of about 1 μm to about 50 μm, for example, rather than present as primary particles in the resin 11. The aggregate 12 refers to primary particles of the carbon black 12a bonded by an intermolecular force to provide a size of about 1 μm or more, for example.

Before heating and pressurization, as shown in FIG. 3A, the aggregate 12 is floating in the resin 11, without making contact with the metal plate 1 or the electrode 3. Therefore, the metal plate 1 is not electrically connected to the electrode 3. The lower content of the carbon black 12a included in the electrically conductive adhesive 10 and the larger amount of the resin 11 reduces the viscosity-thixotropy of the adhesive, thereby resulting in favorable workability and application property.

When the metal plate 1 and the piezoelectric body 2 are subjected to heating and pressurization, the aggregate 12 is deformed so as to follow the concave-convex surfaces of the metal plate 1 and the electrode 3 as shown in FIG. 3B, and thus, is sandwiched between the metal plate 1 and the electrode 3. Therefore, the metal plate 1 is effectively and securely electrically connected to the electrode 3. Since the carbon black 12a is hardened while remaining as the aggregate 12 rather than in a dispersed state, the metal plate 1 and the electrode 3 of the piezoelectric body 2 are electrically connected to each other at multiple points in island shapes (anisotropic electrical conductivity). The electrically conductive structure with anisotropic conductivity greatly improves the contact probability of the carbon black 12a, as compared to a case in which the same amount of carbon black 12a is in a dispersed state, thereby enabling a higher conductivity (a lower resistance value) to be achieved.

In the case of FIG. 3B, when pressurization is performed so that the distance d between the metal plate 1 and the piezoelectric body 2 is less than the average particle size of the aggregate 12, the metal plate 1 and the electrode 3 can preferably not only be electrically connected to each other with the aggregate 12 interposed therebetween, but can also be directly connected to each other. Therefore, the conductivity is further improved for the both the metal plate 1 and the electrode 3. It is to be noted that the distance d between the metal plate 1 and the piezoelectric body 2 can be obtained as a value, in such a way that the region (area) surrounded by the surface of the metal plate 1 and the electrode 3 of the piezoelectric body 2 is divided by a predetermined length when the predetermined length is extracted in the horizontal direction of FIG. 3B. More specifically, the distance d refers to the interval between the position of the center line with respect to the profile curve at the surface of the metal plate and the position of the center line with respect to the profile curve at the surface of the electrode of the piezoelectric body.

Figure 4A:
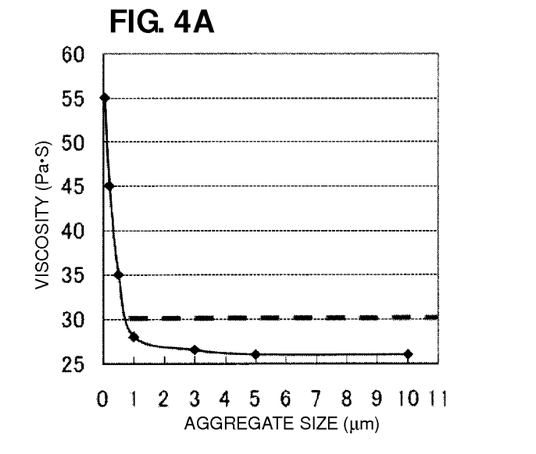
FIG. 4A is a diagram showing the relationship between an aggregate size and an adhesive viscosity.
Figure 4B:
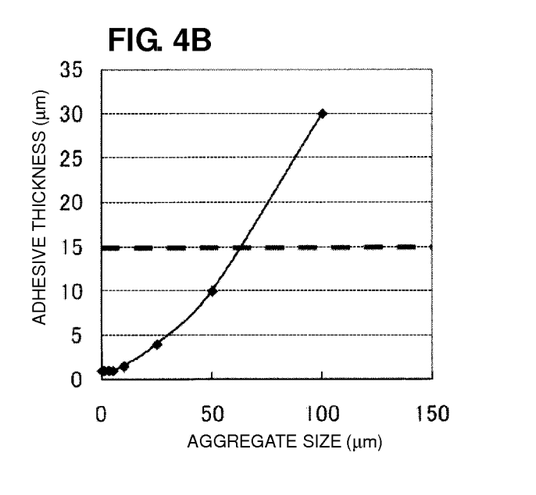
FIG. 4B is a diagram showing the relationship between an aggregation size and an adhesive thickness.

FIG. 4A shows the relationship between the aggregate size and the adhesive viscosity, and FIG. 4B shows the relationship between the aggregate size and the adhesive thickness. It is to be noted that the content of the carbon black was about 3.0 weight %. As shown in FIG. 4A, the particle size of the aggregate less than about 1 μm sharply increases the viscosity of the adhesive, and the particle size of the aggregate is thus preferably about 1 μm or more, for example. On the other hand, as shown in FIG. 4B, the adhesive thickness increases with the increase in the particle size of the aggregate, and in particular, the particle size greater than about 50 μm increases the rate of increase in adhesive thickness, and thus, makes vibrations of the piezoelectric body less likely to be transmitted to the metal plate, thereby resulting in a degradation of product characteristics. Therefore, the average particle size of the aggregate is preferably about 1 μm to about 50 μm, for example.

Figure 5:
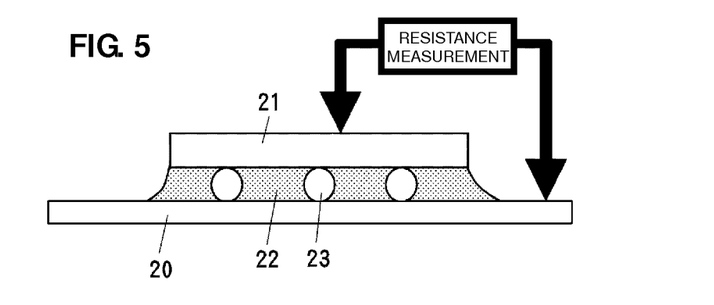
FIG. 5 is a diagram for evaluating the conductivity in the case of bonding two metal plates with the use of an electrically conductive adhesive.

FIG. 5 is a diagram for evaluating the conductivity in the case of bonding two metal plates 20, 21 with the use of an electrically conductive adhesive 22. For this evaluation, on the assumption that the adhesive thickness varies, the metal plates 20, 21 were bonded with the electrically conductive adhesive 22 including insulating spacers 23 having a diameter of about 3 μm interposed therebetween, so as to provide a thickness of about 3 μm, and the series resistance was measured between the metal plates 20, 21. The evaluation results are shown in Table 1. It is to be noted that the amount of the components in the adhesive was about 3 weight % for carbon black and about 97 weight % for an epoxy resin. The carbon black (primary particles) had an average particle size of about 50 nm, the aggregate had an average particle size of about 5 μm, and spherical carbon had a particle size of about 3 μm.

TABLE 1

| Electrically Conductive Adhesive | Carbon Free | Dispersed Carbon | Aggregated Carbon | Spherical Carbon |
| --- | --- | --- | --- | --- |
| Series Resistance (Ω) | 7500 | 105 | 10 | 100 |

As is clear from Table 1, when using aggregated carbon black according to preferred embodiments of the present invention, the series resistance is dramatically low, as compared to when no carbon black is included, and furthermore, the resistance value can be reduced to about 1/10 or less as compared to when the dispersed carbon black or the spherical carbon is included. More specifically, the electrical conductivity is dramatically improved.

Figure 6A:
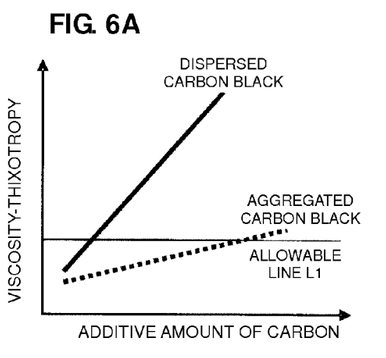
FIGS. 6A and 6B are diagrams for comparing the viscosity-thixotropy and series resistance characteristics between a case of adding dispersed carbon black and a case of adding aggregated carbon black.
Figure 6B:
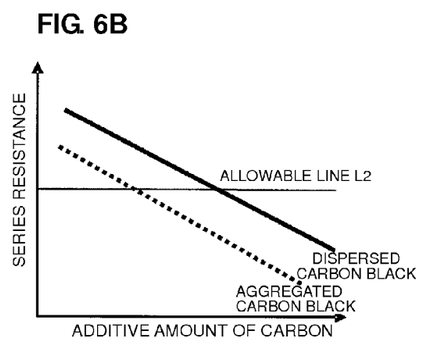

FIGS. 6A and 6B are diagrams for comparing the viscosity-thixotropy and series resistance characteristics between a case in which dispersed carbon black is added and a case in which aggregated carbon black is added. FIG. 6A is a diagram showing the relationship between the additive amount of carbon black and the viscosity-thixotropy, where the change in viscosity-thixotropy is smaller with respect to the additive amount of carbon in the case of the aggregated carbon black, as compared to the dispersed carbon black. Therefore, when an allowable line L1 is set for the viscosity-thixotropy, the additive amount of carbon can be further increased for the aggregated carbon black as compared to the dispersed carbon black. In addition, when a comparison is made with the same additive amount of carbon, the aggregated carbon black has lower viscosity-thixotropy, and thus, provides favorable application stability (variations in the amount of application, leveling properties after the application) in the step of applying the adhesive. On the other hand, as shown in FIG. 6B, there is an inverse relationship between the additive amount of carbon black and the series resistance, and when a predetermined allowable line L2 is set, a smaller amount of the aggregated carbon black achieves a desirable resistance value. More specifically, the additive amount of the aggregated carbon black can be reduced to a greater extent when the same viscosity or resistance value is to be achieved. Therefore, the cost is reduced.

As described above, the advantageous effects of the bonding structure according to preferred embodiments of the present invention are summarized as follows.

Since the aggregate of carbon black is deformed in a flexible manner, an increase in thickness is less affected by the adhesive.

Since the aggregate of carbon black is deformed in a flexible manner during bonding by pressurization, damage to the piezoelectric body is prevented or minimized.

Since the carbon black is present as aggregates (in clusters), the contact probability of the carbon black is greatly improved, and a higher conductive effect (anisotropic conductivity) is achieved as compared to the case in which the same amount of carbon black is present in a non-aggregated (primary particle) state.

Since the electrically conductive adhesive has anisotropic conductivity in the bonded state, short-circuiting s prevented even when a fillet formed around the piezoelectric body partially wraps around the electrode at the surface.

The reliability of electrical conductivity is improved because the flexible deformation of the carbon black aggregate more effectively responds to a swelling adhesive in a humidity test.

As compared to primary particles of carbon black dispersed in a resin, the fluidity of the resin is greater, and the influence on the viscosity-thixotropy is substantially suppressed.

Figure 7:
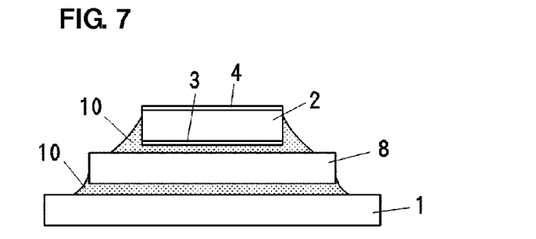
FIG. 7 shows another example of a piezoelectric vibration plate which includes a piezoelectric body bonded to a metal plate with an intermediate plate interposed therebetween.

The bonding structure according to preferred embodiments of the preset invention is not limited to the structure with the piezoelectric body 2 directly bonded onto the diaphragm 1 as shown in FIG. 1, and may be a structure in which a metallic intermediate plate 8 is bonded on the diaphragm 1 and the piezoelectric body 2 is bonded thereon as shown in FIG. 7. In this case, the electrically conductive adhesive 10 according to a preferred embodiment of the present invention is disposed between the diaphragm 1 and the intermediate plate 8 and between the intermediate plate 8 and the piezoelectric body 2, and because the electrically conductive adhesive 10 is highly conductive and provides excellent adhesion as described above, favorable conductivity and bonding properties are ensured among the electrode 3 of the piezoelectric body 2, the intermediate plate 8, and the diaphragm 1. In the bonding structure according to preferred embodiments of the present invention, the metal plate and the piezoelectric body may have any suitable shape, such as a disk shape, a quadrangular plate shape, or an annular shape, for example. The piezoelectric vibration plate according to preferred embodiments of the present invention can be used not only for piezoelectric microblowers for the transportation of compressible fluid such as air, but also for piezoelectric fans, piezoelectric micropumps for the transportation of incompressible fluid such as water, piezoelectric speakers, piezoelectric buzzers, piezoelectric sensors, and other suitable piezoelectric devices, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A bonding method in which a metal plate and a piezoelectric body including an electrode provided on a side of the piezoelectric body opposed to the metal plate are bonded to each other using an electrically conductive adhesive including carbon black as an electrically conductive aid, so as to provide electrical conductivity between the metal plate and the electrode of the piezoelectric body, the bonding method comprising the steps of:

applying the electrically conductive adhesive in a paste form between the metal plate and the electrode of the piezoelectric body, the electrically conductive adhesive including carbon black with a nano-level average particle size, and the electrically conductive adhesive being included in a solventless or solvent-based resin so that the carbon black form an aggregate with an average particle size of about 1 μm to about 50 μm; and after applying the electrically conductive adhesive, subjecting the metal plate and the piezoelectric body to heating and pressurization to deform the aggregate, and hardening the electrically conductive adhesive;

wherein prior to the heating and pressurization, the aggregate is floating in the solventless or solvent-based resin without contacting the metal plate or the electrode.

2. The bonding method according to claim 1, wherein the metal plate and the piezoelectric body are subjected to pressurization so that a distance between the metal plate and the electrode of the piezoelectric body is less than the average particle size of the aggregate.

3. The bonding method according to claim 1, wherein the aggregate is deformed so as to follow concave-convex surfaces of the metal plate and the electrode.

4. The bonding method according to claim 1, wherein the electrically conductive adhesive includes the carbon black with the nano-level average particle size in a range of about 5 nm to about 300 nm.

5. A bonding method in which a metal plate and a piezoelectric body including an electrode provided on a side of the piezoelectric body opposed to the metal plate are bonded to each other using an electrically conductive adhesive including carbon black as an electrically conductive aid, so as to provide electrical conductivity between the metal plate and the electrode of the piezoelectric body, the bonding method comprising the steps of:

applying the electrically conductive adhesive in a paste form between the metal plate and the electrode of the piezoelectric body, the electrically conductive adhesive including carbon black with a nano-level average particle size, and the electrically conductive adhesive being included in a solventless or solvent-based resin so that the carbon black form an aggregate with an average particle size of about 1 μm to about 50 μm, the aggregate including only the carbon black; and after applying the electrically conductive adhesive, subjecting the metal plate and the piezoelectric body to heating and pressurization to deform the aggregate, and hardening the electrically conductive adhesive.

6. The bonding method according to claim 5, wherein the metal plate and the piezoelectric body are subjected to pressurization so that a distance between the metal plate and the electrode of the piezoelectric body is less than the average particle size of the aggregate.

7. The bonding method according to claim 5, wherein the aggregate is deformed so as to follow concave-convex surfaces of the metal plate and the electrode.

* * * * *